US011757248B2

(12) United States Patent
Di Teodoro et al.

(10) Patent No.: US 11,757,248 B2
(45) Date of Patent: Sep. 12, 2023

(54) SYSTEM AND METHOD FOR SPECTRAL LINE SHAPE OPTIMIZATION FOR SPECTRAL BEAM COMBINING OF FIBER LASERS

(71) Applicant: Raytheon Company, Waltham, MA (US)

(72) Inventors: Fabio Di Teodoro, Hacienda Heights, CA (US); Justin Paul, Melissa, TX (US)

(73) Assignee: Raytheon Company, Waltham, MA (US)

( * ) Notice: Subject to any disclaimer, the term of this patent is extended or adjusted under 35 U.S.C. 154(b) by 1039 days.

(21) Appl. No.: 16/517,394

(22) Filed: Jul. 19, 2019

(65) Prior Publication Data
US 2021/0021095 A1 Jan. 21, 2021

(51) Int. Cl.
*H01S 3/23* (2006.01)
*H01S 3/13* (2006.01)
(Continued)

(52) U.S. Cl.
CPC .......... *H01S 5/0085* (2013.01); *H01S 3/1003* (2013.01); *H01S 3/1307* (2013.01);
(Continued)

(58) Field of Classification Search
CPC ......... H01S 3/2308–235; H01S 3/2375; H01S 3/1307; H01S 3/10053; H01S 3/0085;
(Continued)

(56) References Cited

U.S. PATENT DOCUMENTS

| 5,907,436 A | 5/1999 | Perry et al. |
| 6,678,294 B1 * | 1/2004 | Komine ............... H01S 3/2383 372/28 |

(Continued)

FOREIGN PATENT DOCUMENTS

| CN | 111725693 A | * | 9/2020 |
| JP | 08006078 A | * | 1/1996 |

(Continued)

OTHER PUBLICATIONS

Harish et al., "Optimization of Phase Modulation with Arbitrary Waveform Generators for Optical Spectral Control and Suppression of Stimulated Brillouin Scattering", Mar. 9, 2015, Optics Express, vol. 23, No. 6, 6988-6999. (Year: 2015).*

(Continued)

*Primary Examiner* — Joshua King

(57) ABSTRACT

A system includes at least one controller configured to determine an optical phase modulation pattern for suppression of stimulated Brillouin scattering (SBS) in a combined beam that emerges off a diffractive grating in a spectral beam combining (SBC) system and maximization of an output power of the combined beam. The system also includes multiple master oscillators configured to generate multiple beams in the SBC system. The system also includes multiple phase modulators configured to phase modulate the multiple beams according to the determined optical phase modulation pattern. The system also includes multiple fiber amplifier chains configured to receive the phase modulated beams and output the beams from the master oscillators to multiple delivery fibers for subsequent combining into the combined beam at the diffractive grating.

22 Claims, 7 Drawing Sheets

(51) Int. Cl.
  *H01S 3/10* (2006.01)
  *H01S 5/00* (2006.01)
  *H01S 5/40* (2006.01)
  *H01S 3/00* (2006.01)

(52) U.S. Cl.
  CPC .......... *H01S 3/2308* (2013.01); *H01S 3/2391* (2013.01); *H01S 5/4012* (2013.01); *H01S 3/005* (2013.01); *H01S 3/10053* (2013.01); *H01S 3/1301* (2013.01); *H01S 3/2375* (2013.01); *H01S 2301/03* (2013.01)

(58) Field of Classification Search
  CPC .... H01S 3/005; H01S 3/0057; H01S 2301/03; H01S 5/4012
  See application file for complete search history.

(56) References Cited

U.S. PATENT DOCUMENTS

| | | | |
|---|---|---|---|
| 6,708,003 B1* | 3/2004 | Wickham | H04B 10/1121 398/161 |
| 7,199,924 B1* | 4/2007 | Brown | H01S 3/2383 398/87 |
| 7,346,085 B1* | 3/2008 | Rothenberg | G02B 19/0057 372/29.016 |
| 7,436,588 B2* | 10/2008 | Rothenberg | B23K 26/705 359/349 |
| 7,440,174 B2* | 10/2008 | Rice | H01S 3/06754 372/29.016 |
| 7,761,011 B2* | 7/2010 | Gopinath | H04B 10/503 398/32 |
| 8,493,650 B2* | 7/2013 | Rothenberg | H01S 3/06712 359/337.13 |
| 9,134,538 B1* | 9/2015 | Augst | H01S 5/4062 |
| 9,735,537 B1* | 8/2017 | Rothenberg | G02B 27/0927 |
| 10,008,821 B1* | 6/2018 | Goodno | H01S 3/1003 |
| 10,396,523 B1* | 8/2019 | Goodno | H01S 3/1308 |
| 10,408,925 B1* | 9/2019 | Manzur | G01S 17/10 |
| 2007/0201880 A1* | 8/2007 | Nicholson | G02F 1/0327 398/188 |
| 2010/0128744 A1* | 5/2010 | Deladurantaye | H01S 3/06754 372/6 |
| 2011/0032602 A1* | 2/2011 | Rothenberg | G02B 6/02042 359/341.1 |
| 2011/0032603 A1* | 2/2011 | Rothenberg | H01S 3/2383 359/341.1 |
| 2011/0032604 A1* | 2/2011 | Rothenberg | G02B 6/02042 359/341.4 |
| 2011/0085149 A1* | 4/2011 | Nathan | B41M 1/06 359/341.1 |
| 2011/0249692 A1* | 10/2011 | Honea | G02B 6/32 372/29.011 |
| 2011/0280581 A1* | 11/2011 | Chann | H01S 3/067 398/98 |
| 2012/0188626 A1* | 7/2012 | Rothenberg | H01S 3/06712 359/239 |
| 2013/0063808 A1* | 3/2013 | Rothenberg | H01S 3/08054 359/334 |
| 2014/0086267 A1* | 3/2014 | Dennis | H01S 3/10061 359/279 |
| 2015/0188287 A1* | 7/2015 | Mutalik | H04B 10/2931 359/334 |
| 2016/0139266 A1* | 5/2016 | Montoya | G01S 17/42 356/5.01 |
| 2016/0172818 A1* | 6/2016 | Takasaka | H04J 14/0221 398/81 |
| 2017/0299900 A1* | 10/2017 | Montoya | G02F 1/0121 |
| 2018/0159298 A1* | 6/2018 | Spence | H01S 3/06758 |
| 2018/0269645 A1* | 9/2018 | Cannon | H01S 3/0912 |
| 2019/0190225 A1* | 6/2019 | Goodno | H01S 3/06754 |
| 2019/0288479 A1* | 9/2019 | Kawahara | H01S 3/10015 |
| 2019/0305504 A1* | 10/2019 | Goodno | H01S 3/1305 |
| 2019/0305505 A1* | 10/2019 | Goodno | H01S 3/10038 |
| 2020/0227883 A1* | 7/2020 | Goodno | H01S 3/08004 |

FOREIGN PATENT DOCUMENTS

| | | | | |
|---|---|---|---|---|
| WO | WO-0163818 A1 * | 8/2001 | | H04J 14/02 |
| WO | WO-2015042842 A1 * | 4/2015 | | H01S 3/005 |
| WO | WO-2018100579 A1 * | 6/2018 | | H01S 3/06754 |
| WO | WO-2018105733 A1 * | 6/2018 | | H01S 3/10015 |
| WO | WO-2020009972 A1 * | 1/2020 | | G02F 1/0356 |
| WO | WO-2020236260 A1 * | 11/2020 | | H01S 3/0064 |

OTHER PUBLICATIONS

Harish, "Advanced Modulation Schemes for Suppression of Stimulated Brillouin Scattering in Optical Fibre Amplifiers", Sep. 2017, University of Southampton, 1-125 (Year: 2017).*
Sanchez-Rubio et al., "Wavelength Beam Combining for Power and Brightness Scaling of Laser Systems," Lincoln Laboratory Journal, vol. 20, No. 2, 2014, pp. 52-66.
Honea et al., "Advances in fiber laser spectral beam combining for power scaling," Proceedings of SPIE, vol. 9730, 2016, 10 pages.
Zeringue et al., "A theoretical study of transient stimulated Brillouin scattering in optical fibers seeded with phase-modulated light," Optics Express, vol. 20, No. 19, Sep. 2012, pp. 21196-21213.
Anderson et al., "Comparison of phase modulation schemes for coherently combined fiber amplifiers," Optics Express vol. 23, No. 21, Oct. 2015, pp. 27046-27060.
Hocquet et al., "Non-sinusoidal phase modulations for high-power laser performance control: stimulated Brillouin scattering and FM-to-AM conversion," Applied Optics, vol. 49, No. 7, Mar. 2010, pp. 1104-1115.
Flores et al., "Pseudo-random binary sequence phase modulation for narrow linewidth, kilowatt, monolithic fiber amplifiers," Optics Express, vol. 22, No. 15, Jul. 2014, pp. 17735-17744.
White et al., "Seeding fiber amplifiers with piecewise parabolic phase modulation for high SBS thresholds and compact spectra," Optics Express, vol. 27, No. 3, Feb. 2019, pp. 2962-2974.
Smith et al., "Mode instability in high-power fiber amplifiers," Optics Express, vol. 19, No. 11, May 2011, pp. 10180-10192.
Cheung et al., "High density spectral beam combination with spatial chirp precompensation," Optics Express, vol. 19, No. 21, Oct. 2011, pp. 20984-20990.
Loftus et al., "Spectrally Beam-Combined Fiber Lasers for High-Average-Power Applications," IEEE Journal of Selected Topics in Quantum Electronics, vol. 13, No. 3, May/Jun. 2007, pp. 487-497.
Supradeepa, "Stimulated Brillouin scattering thresholds in optical fibers for lasers linewidth broadening with noise," Optics Express, vol. 21, No. 4, Feb. 2013, pp. 4677-4687.
International Search Report and Written Opinion of the International Search Authority in connection with International Patent Application No. PCT/US2020/026723 dated Jul. 10, 2020, 13 pages.
Flores et al., "Multi-kilowatt diffractive coherent combining of pseudorandom-modulated fiber amplifiers," Optical Engineering, vol. 55, Issue 9, Sep. 2016, 8 pages.
Jiang et al., "Phase modulation signals optimization automatically for suppression of stimulated Brillouin scattering," High-Power Lasers and Applications VIII, Proceedings of SPIE, vol. 10016, Nov. 2016, 6 pages.
Strecker et al., "Highly efficient dual-grating 3-channel spectral beam combining of narrow-linewidth monolithic cw Yb-doped fiber amplifiers up to 5.5 kW," Fiber Lasers XVI: Technology and Systems, Proceedings of SPIE, vol. 10897, Mar. 2019, 6 pages.

* cited by examiner

SYSTEM AND METHOD FOR SPECTRAL LINE SHAPE OPTIMIZATION FOR SPECTRAL BEAM COMBINING OF FIBER LASERS

TECHNICAL FIELD

This disclosure is directed in general to laser systems. More specifically, this disclosure relates to a system and method for spectral line shape optimization for spectral beam combining of fiber lasers.

BACKGROUND

Spectral beam combining (SBC) is a well-established approach to power-scaling of fiber laser sources (FLSs). A frequently adopted embodiment of SBC includes wavelength-multiplexing an array of fiber-based master-oscillator/power-amplifier (MOPA) units, in which each master oscillator (usually a diode laser) is set to operate at a specific wavelength. The multiplexer can be a dispersive optical element, e.g., a diffractive grating. Individual beams from the array spatially overlap at the grating and emerge spatially overlapped into the far field upon diffraction. The combined output beam thus carries the sum of the power from all component FLSs while retaining the beam quality of individual FLSs, thereby effectively trading spectral brightness for spatial brightness. Since it does not rely on precise optical-phase matching across an array of lasers, SBC is often viewed as a relatively simpler to implement alternative to coherent beam combining for directed-energy (DE) applications. Since the diffraction off a grating couples spectral to spatial characteristics of incident light, SBC of fiber-based MOPA units does however require proper selection of the central operating wavelength of each unit as well as control of the spectral content of the emission from each unit. In particular, the spectral content must be tailored to addressing at least two requirements: the suppression of power-limiting nonlinear effects within each fiber-based MOPA and the optimization of the spatial quality in the combined beam emerging off the grating.

SUMMARY

This disclosure provides a system and method for spectral line shape optimization for spectral beam combining of fiber lasers.

In a first embodiment, a system includes at least one controller configured to determine an optical phase modulation pattern for suppression of stimulated Brillouin scattering (SBS) in a combined beam that emerges off a diffractive grating in a spectral beam combining (SBC) system and maximization of an output power of the combined beam. The system also includes multiple master oscillators configured to generate multiple beams in the SBC system. The system also includes multiple phase modulators configured to phase modulate the multiple beams according to the determined optical phase modulation pattern. The system also includes multiple fiber amplifier chains configured to receive the phase modulated beams from the master oscillators and output the beams to multiple delivery fibers for subsequent combining into the combined beam at the diffractive grating.

In a second embodiment, an apparatus includes at least one controller configured to determine an optical phase modulation pattern for suppression of SBS in a combined beam that emerges off a diffractive grating in a SBC system and maximization of an output power of the combined beam. The apparatus also includes a master oscillator configured to generate a first beam of multiple beams in the SBC system. The apparatus also includes a phase modulator configured to phase modulate the first beam according to the determined optical phase modulation pattern. The apparatus also includes a fiber amplifier chain configured to receive the phase modulated first beam from the master oscillator and output the first beam to a delivery fiber for subsequent combining of the first beam and the multiple beams into the combined beam at the diffractive grating.

In a third embodiment, a method includes determining an optical phase modulation pattern, the optical phase modulation pattern determined to suppress SBS in a combined beam that emerges off a diffractive grating in a SBC system and maximize an output power of the combined beam. The method also includes generating multiple beams using multiple master oscillators in the SBC system. The method also includes phase modulating the beams using multiple phase modulators according to the determined optical phase modulation pattern. The method also includes receiving the phase modulated beams from the master oscillators at multiple fiber amplifier chains and outputting the beams to multiple delivery fibers for subsequent combining into the combined beam at the diffractive grating.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
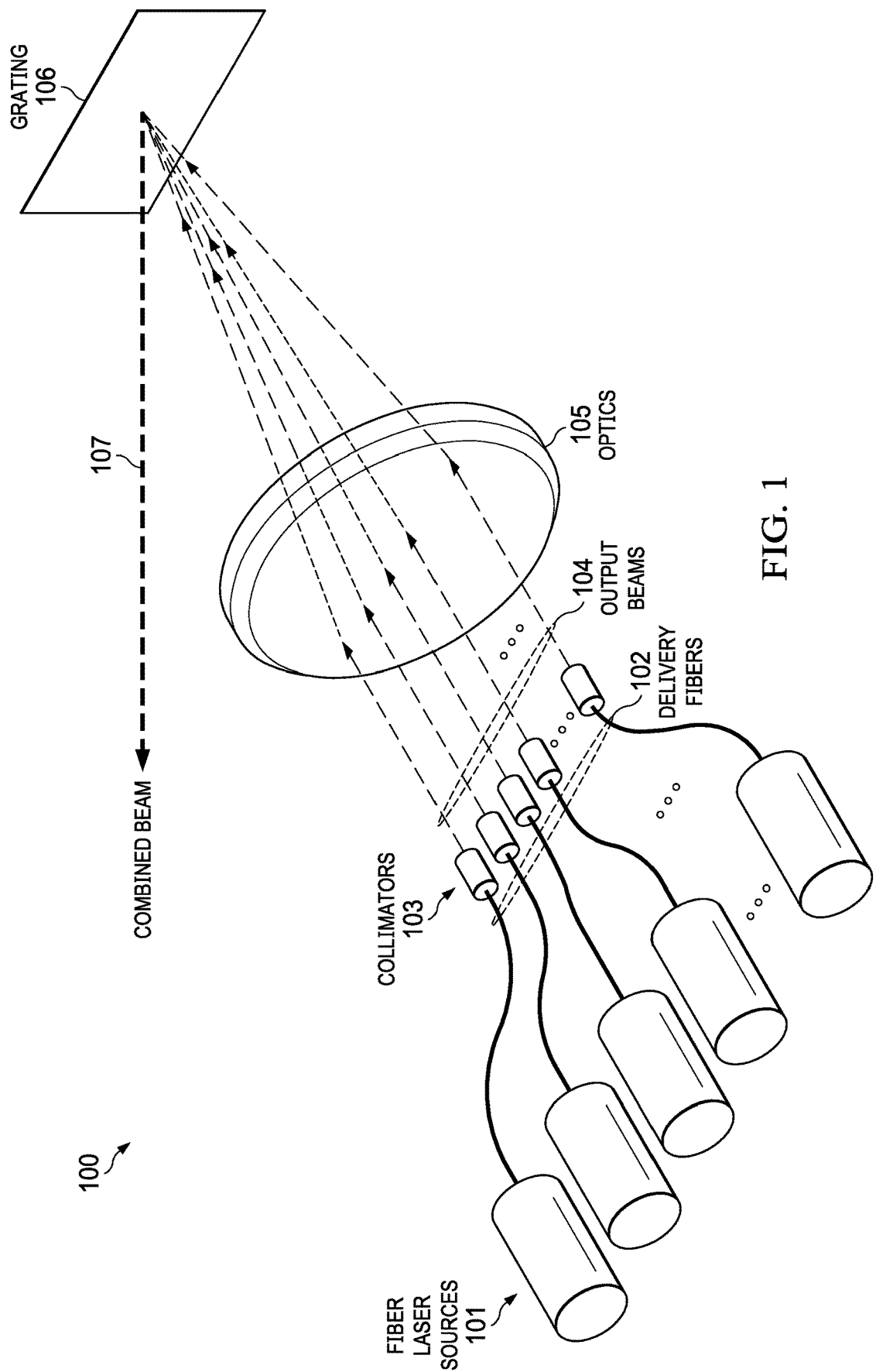
FIG. 1 illustrates an example system for spectral beam combining of fiber laser sources according to this disclosure.

The figures described below and the various embodiments used to describe the principles of the present disclosure in this patent document are by way of illustration only and should not be construed in any way to limit the scope of the disclosure. Those skilled in the art will understand that the principles of the present disclosure may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity, and is not meant to imply that the feature or component cannot be employed in the embodiments described in connection with that figure.

As discussed above, SBC is a well-established approach to power-scaling of fiber laser sources (FLSs), each of which usually comprise a master oscillator followed by a fiber-amplifier chain. A common SBC guideline is to maximize available power from individual component FLSs so as to reduce the required FLS count, and the overall system complexity, towards a target power goal. In "thermal" DE applications, continuous-wave (CW) FLSs are normally employed, which singles out stimulated Brillouin scattering (SBS) as the limitation to the output power. A practical method to increase the SBS threshold power is to deliberately broaden the spectral width (i.e., reduce the coherence time for SBS build-up) of individual FLSs. This method is usually implemented by an external phase modulator to impart certain optical-phase patterns onto the seed beam generated by the master oscillator. Examples of such patterns include periodic modulation, filtered white noise, pseudo-random bit sequences, and chirped waveforms. With such techniques, FLSs with spectral line widths 10 GHz and greater have been scaled to multi-kW power, limited by thermo-optic effects such as mode instability or other non-linear effects such as four-wave mixing, but not SBS.

In diffractive grating-based SBC implementations, however, beams of finite spectral width undergo spatial quality degradation in the grating dispersion plane, because the grating maps different spectral components into different angles, thus causing the emerging beam to diverge beyond the diffraction limit. This effect is sometime referred to as spatial chirp. According to an often cited result, if the FLSs being combined exhibit a Gaussian spectral profile, the beam quality factor $M^2$ (in the dispersive direction) for the spatial-chirp-limited SBC output is given by the simple expression:

$$M^2 = \sqrt{1 + \left(\frac{\pi \mathcal{N} \Delta_\lambda w_0}{2 \lambda_0 \cos\theta_L}\right)^2}. \quad (1)$$

Here, $\mathcal{N}$ is the number of grating lines per unit length, $\Delta_\lambda$ is the $1/e^2$ full-width of the beam Gaussian spectral profile, $w_0$ is the beam waist radius (in the dispersive direction) at the grating, $\lambda_0$ is the central wavelength, and $\theta_L$ is the Littrow angle.

In general, minimizing the spectral broadening $\Delta_\lambda$ required to achieve a given SBS-free power, hence the dispersion-driven beam quality degradation, is an established SBC design objective. However, the impact that more general, non-Gaussian FLS spectral profiles have on the beam quality of FLS-based SBC systems has not been addressed in the art, nor has a method to control and improve the beam quality in SBC via the optimization of the FLS spectrum been described.

To address these issues, embodiments of this disclosure provide SBC architectures featuring FLSs in which SBS is suppressed through optical phase-modulation patterns designed to achieve simultaneous objectives, including the maximization of the output power in each FLS and thus in the combined beam, suppression of SBS, and optimization of SBC beam quality.

It will be understood that embodiments of this disclosure may include any one, more than one, or all of the features described here. Also, embodiments of this disclosure may additionally or alternatively include other features not listed here. While the disclosed embodiments may be described with respect to laser systems in military applications, these embodiments are also applicable in any other suitable systems or applications.

Spectral Beam Combining of Fiber Laser Sources

FIG. 1 illustrates an example system 100 for SBC of FLSs according to this disclosure. As shown in FIG. 1, the system 100 includes multiple FLSs 101. Each FLS 101 is coupled to an output delivery fiber 102, the distal ends of which are arranged in a linear array, often referred to as "launch" array. In some embodiments, output beams 104 exiting the delivery fibers 102 are first transmitted through individual collimators 103, such as plano-convex aspheric lenses installed one focal length away from the delivery fiber facets or integrated within fusion-spliced fiber endcaps.

The parallel, collimated beams 104 from the FLSs 101 impinge upon a refractive or reflective transform optical component 105, which directs the FLS output beams 104 to spatially overlap onto a diffractive grating 106. A combined beam 107 then emerges from the grating 106. In some embodiments, the transform optical component 105 is positioned one focal length away from the launch array and from the grating 106.

A relationship exists among proper focal length, f, of the transform optical component; wavelength difference between FLSs, $\Delta\lambda$; and spacing, $\Delta x$, of fiber ends in the launch array. In many embodiments, $f \gg \Delta x$ and thus $$\Delta x \sim \mathcal{N} f \Delta \lambda, \quad (2)$$

where $\mathcal{N}$ is the number of grating lines per unit length.

Many implementations of SBC rely on diffractive gratings featuring a highly reflective multi-layer dielectric (MLD) coating topped by precisely etched relief structures. Similar to blazed gratings, MLD gratings are designed for minimal diffraction efficiency into any order except the first and are used at a near-Littrow angle of incidence, such that the combined beam emerges from the grating at the Littrow angle as well. If the beams being combined exhibit finite spectral width, the central-wavelength spectral component in each beam is diffracted at the Littrow angle, whereas other spectral components are diffracted at different angles due to the grating dispersion. As stated above, the ensuing angular spread in the diffracted beam amounts to excess far-field divergence and, therefore, degraded beam quality.

Diffracted Beam Quality Degradation Caused by the FLS Spectral Content

The FLSs described hereinafter comprise fiber-based MOPAs in which the terminal fiber amplifier operates in the fundamental transverse mode and thus emit a beam of optical intensity well approximated by a diffraction-limited circular Gaussian profile. In the case of an incident beam having a single wavelength $\lambda_0$ and negligible spectral width, the beam emerges off the grating at the Littrow angle ($\theta_L$).

If the z-axis of the coordinate system is oriented along the propagation direction of this emerging beam, the optical intensity can then be expressed as:

$$I(x, y, z; \lambda_0) = I_{peak}(\lambda_0) \exp\left\{-2\left[\frac{x}{w_x(z, \lambda_0)}\right]^2\right\} \exp\left\{-2\left[\frac{y}{w_y(z, \lambda_0)}\right]^2\right\}, \quad (3)$$

where $I_{peak}$ is the peak intensity and $w_{x,y}(z,\lambda_0)$ denotes the $1/e^2$ beam radii with respect to the x and y coordinates in the transverse plane orthogonal to the beam propagation direction, respectively, at a position z along the beam propagation direction, where:

$$I_{peak}(\lambda_0) = \frac{2P(\lambda_0)}{\pi w_x(z, \lambda_0) w_y(z, \lambda_0)}, \quad (4)$$

and $$w_{x,y}(z, \lambda_0) \sim \frac{\lambda_0 z}{\pi w_{x0,y0}}. \quad (5)$$

In Equations (4) and (5), $P(\lambda_0)$ is the beam power associated with the wavelength $\lambda_0$; $w_{x0,y0}$ are the $1/e^2$ beam radii in the x and y direction, respectively, at a beam-waist location where z=0; and large z values are assumed, i.e. $z \gg z_R$, where $z_R$ is the Rayleigh range given by $$z_R = \frac{\pi w_0^2}{\lambda}.$$

Although FIG. 1 illustrates one example system for SBC of FLSs, various changes may be made to FIG. 1. In general, the makeup and arrangement of the system 100 are for illustration only. Components could be added, omitted, combined, or placed in any other configuration according to particular needs.

Although Equations (3)-(5) and the language used to discuss them refer to a specific case in which each combined FLS emits a diffraction-limited Gaussian beam, the same mathematical arguments used herein and in the following description can readily be extended to encompass non-Gaussian spatial beam distributions, including, but not limited to, near-Gaussian beams characterized by a beam quality factor $M^2>1$, beams having a near-field spatial profile given by any superposition of cylindrically symmetric fiber transverse modes, as well as beams processed by special optical components and/or being emitted by fibers having rectangular or otherwise non-cylindrically symmetric cross sections, which thus exhibit a spatial profile not necessarily given by a superposition of cylindrically-symmetric transverse modes.

Figure 2:
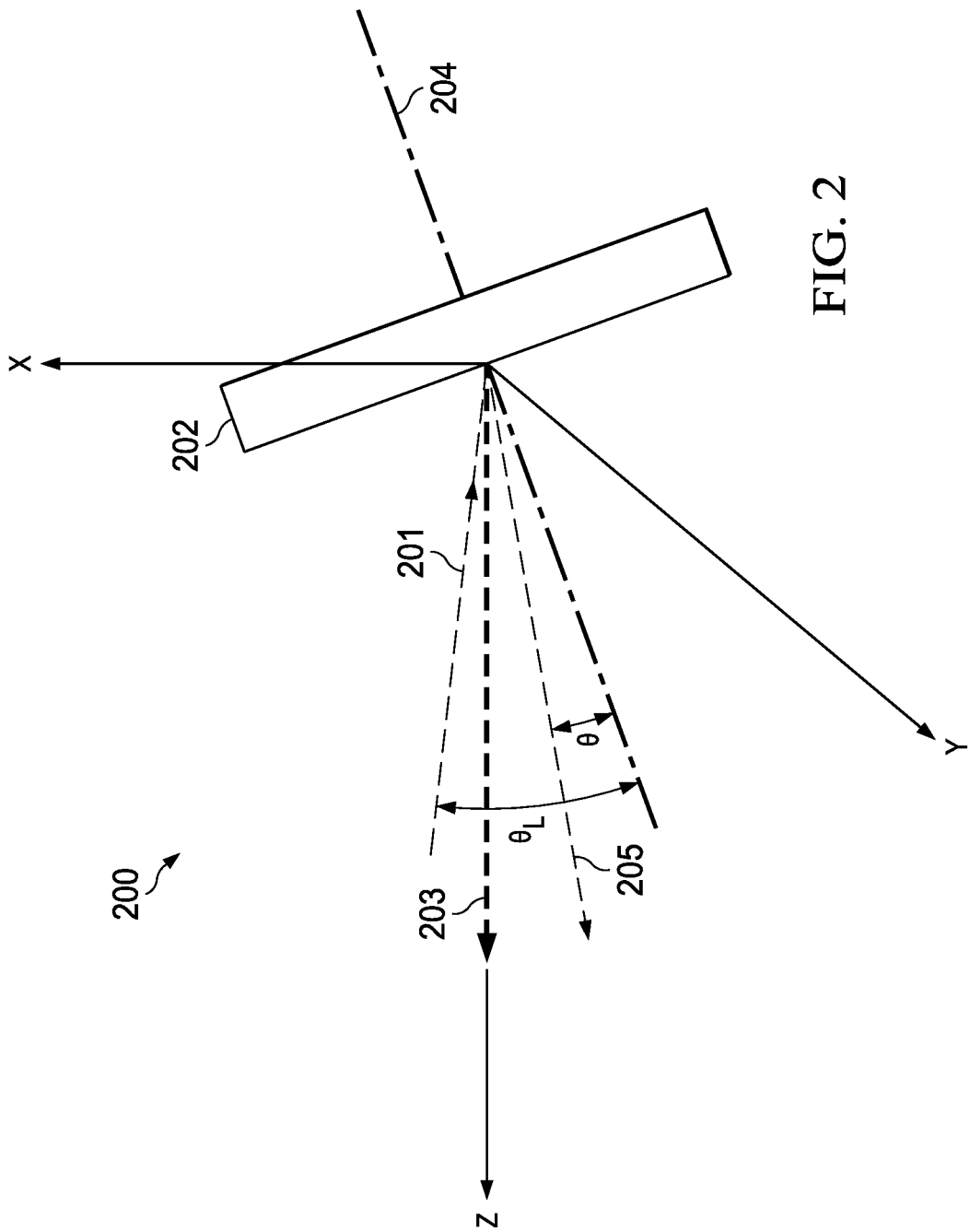
FIG. 2 illustrates an example case of spectral beam combining with beams exhibiting finite spectral content according to this disclosure.

FIG. 2 illustrates an example case 200 of SBC with beams exhibiting finite spectral content according to this disclosure. The example case 200 illustrates spectral contributions to the optical intensity of a beam diffracted off a grating. In FIG. 2, the x axis is coplanar with the page and denotes the dispersive direction for the grating, the y axis comes out of the page, and the z axis is oriented at the Littrow angle off the grating.

Let $\lambda$ be the wavelength of a side spectral component of an incident FLS beam 201. The incident beam 201 has finite spectral width and a central wavelength $\lambda_0$. Upon diffraction, a spectral component 203 of the diffracted beam having wavelength $\lambda_0$ emerges off a diffractive grating 202, propagating at the Littrow angle ($\theta_L$) with respect to the normal direction 204 to the grating 202. The spectral component 205 of the diffracted beam having wavelength $\lambda$ emerges off the grating 202 at an angle $\theta'$ satisfying the grating equation:

$$\sin\theta - \sin\theta_L = \mathcal{N}\sigma, \quad (6)$$

where $\sigma \equiv \lambda - \lambda_0$. In some embodiments, the FLS spectrum is relatively narrow ($\sigma \ll \lambda_0$) and Equation (6) can be rewritten to a first-order approximation as:

$$\gamma \sim \frac{\mathcal{N}\sigma}{\cos\theta_L}, \quad (7)$$

where $\gamma \equiv \theta - \theta_L$. Thus, the optical intensity of the emerging beam, comprising both spectral components, can be written as:

$$I(x,y,z) = I(x,y,z;\lambda_0) + I(x,y,z;\lambda), \quad (8)$$

where $I(x, y, z; \lambda_0)$ is given by the expression in Equation (3) and $$I(x, y, z; \lambda) = I_{peak}(\lambda) \exp \quad (9)$$

$$\left\{-2\left[\frac{x - z\tan\gamma}{w_x(z, \lambda)(1 - \sigma/\lambda)\cos\gamma}\right]^2\right\} \exp\left\{-2\left[\frac{y\cos\gamma}{w_y(z, \lambda)(1 - \sigma/\lambda)}\right]^2\right\}.$$

To first order, Equation (9) can be simplified as:

$$I(x, y, z; \lambda) \sim I_{peak}(\lambda) \exp\left\{-2\left[\frac{x - z\gamma}{w_x(z, \lambda_0)}\right]^2\right\} \exp\left\{-2\left[\frac{y}{w_y(z, \lambda_0)}\right]^2\right\}. \quad (10)$$

It is noted that, in Equation (10), the optical intensity along the y (i.e., non-dispersive) direction is the same as that in Equation (3), which confirms that the grating 202 affects the spectrally wide beam quality only in the dispersive direction.

In the case of multiple, discrete spectral components of wavelength $\lambda_q$, Equation (8) can be rewritten as:

$$I(x,y,z) = \Sigma_{q=-Q}^{R} I(x,y,z;\lambda_q), \quad (11)$$

where the convention used is that negative values of the summation index q correspond to wavelengths shorter than $\lambda_0$, while Q and R denote the number of spectral components of wavelength shorter and longer than $\lambda_0$, respectively.

Based on Equation (10), Equation (11) can be expanded as:

$$I(x, y, z) = I_{peak} \exp\left\{-2\left[\frac{y}{w_y(z, \lambda_0)}\right]^2\right\} \sum_{q=-Q}^{R} i_q \exp\left\{-2\left[\frac{x - z\gamma_q}{w_x(z, \lambda_0)}\right]^2\right\}. \quad (12)$$

Here, $I_{peak}$ is the absolute peak value of the intensity, $i_q$ is a dimensionless number given by the intensity the q-th spectral line normalized to $I_{peak}$ ($0 < i_q \le 1, i_0 = 1$), and $$\gamma_q = \frac{\mathcal{N}(\lambda_q - \lambda_0)}{\cos\theta_L}. \quad (13)$$

It is also possible to obtain a corresponding expression for the optical intensity in the case of an incident beam exhibiting continuous spectral distribution:

$$I(x, y, z) = I_{peak} \exp\left\{-2\left[\frac{y}{w_y(z,\lambda_0)}\right]^2\right\} \int i(\sigma) \exp\left\{-2\left[\frac{x - z\gamma(\sigma)}{w_x(z,\lambda_0)}\right]^2\right\} d\sigma. \quad (14)$$

Here, $I_{peak}$ is defined as in Equation (12), $i(\sigma)$ is the peak-normalized optical power spectrum, and the integral over $\sigma$ spans all spectral components of the beam.

Equations (12) and (14) are key general results, not limited to Gaussian spectral line shapes, for quantitatively determining the impact of spectral content on beam quality in SBC architectures. The explicit values of these expressions can be calculated numerically. In the particular case of a Gaussian spectrum of $1/e^2$ full width given by $\Delta_\lambda$, $$i(\sigma) = \exp\left(-8\frac{\sigma^2}{\Delta_\lambda^2}\right), \quad (15)$$

the integral in Equation (14) can be calculated analytically:

$$I(x, y, z) \propto \exp\left(-2\frac{y^2}{w_y^2}\right) \exp\left[-2\frac{x^2}{w_x^2 + \left(\frac{N z \Delta_\lambda}{2 \cos \theta_L}\right)^2}\right]. \quad (16)$$

According to Equation (16), the diffraction off the grating causes the beam radius in the dispersive direction to increase from $w_x$ to $w_x'$ given by:

$$w_x' = \sqrt{w_x^2 + \left(\frac{N z \Delta_\lambda}{2 \cos \theta_L}\right)^2}. \quad (17)$$

Substituting Equation (17) in the expression for $M^2$ $$M^2 = \frac{\pi w_x' w_{x0}}{\lambda z} \quad (18)$$

finally yields:

$$M^2 = \frac{\pi \sqrt{w_x^2 + \left(\frac{N z \Delta_\lambda}{2 \cos \theta_L}\right)^2} w_{x0}}{\lambda z} = \sqrt{1 + \left(\frac{\pi N \Delta_\lambda w_{x0}}{2 \lambda_0 \cos \theta_L}\right)^2}, \quad (19)$$

which, as expected, coincides with Equation (1), once the identity $$M^2 = \frac{\pi w_x w_{x0}}{\lambda z} = 1, \quad (20)$$

is applied, which amounts to assuming an initially diffraction-limited Gaussian beam.

Depending on specific aspects of a DE application, different metrics for characterizing beam quality may be preferred to $M^2$. In particular, the fraction of laser power captured within a far-field cone of given angular aperture, also known as the power in the bucket (PiB) metric, is often regarded as more representative of DE efficacy. Regardless of the beam quality metric adopted and spectral content of the beams being combined, the procedure described in this section, which is based on explicitly calculating the optical intensity of the diffracted beam, remains general and still applies.

FLS Architecture

Figure 3:
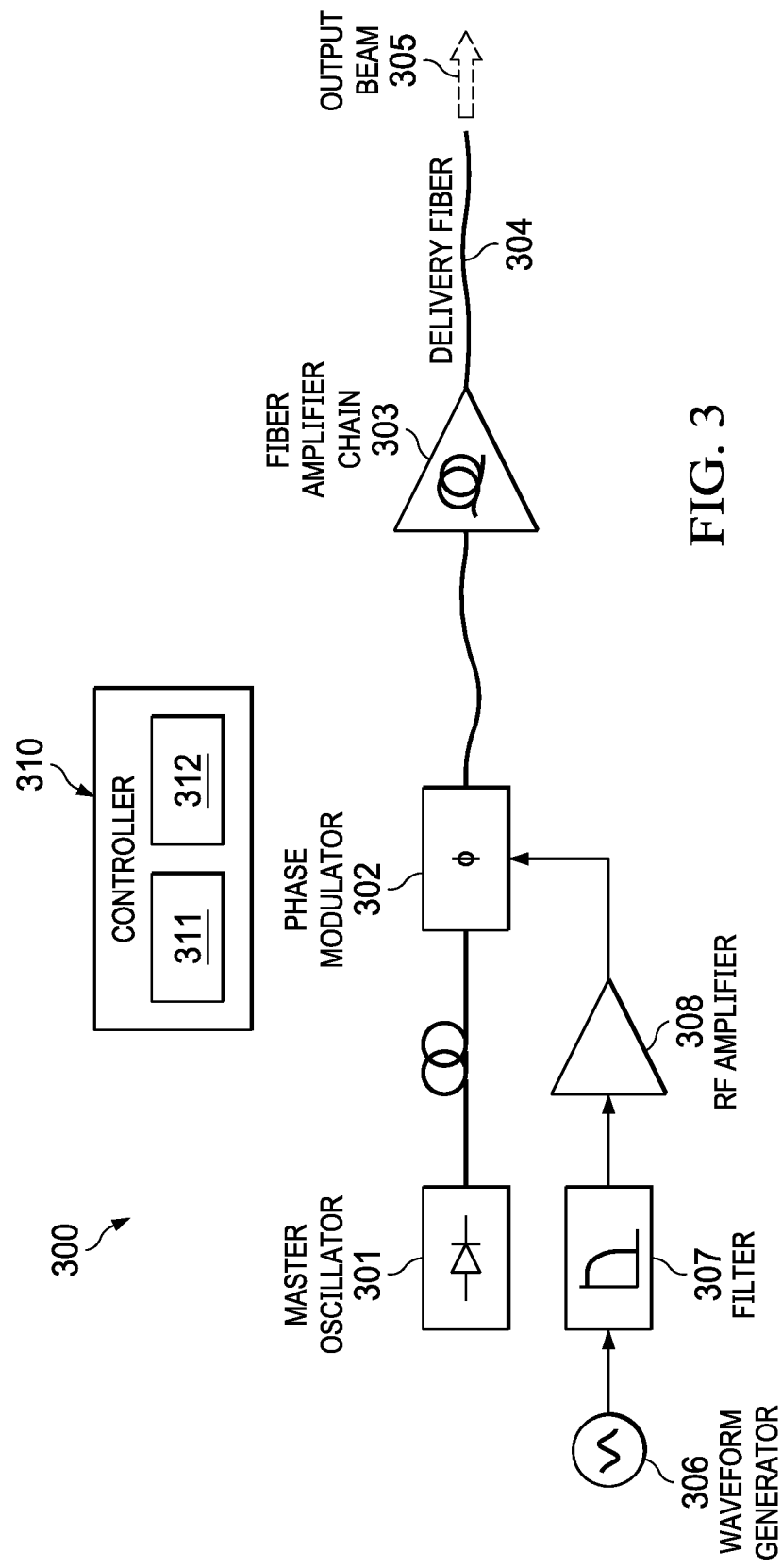
FIG. 3 illustrates a schematic layout of an example fiber laser source usable in spectral beam combining architectures for directed-energy applications, according to this disclosure.

FIG. 3 illustrates a schematic layout of an example FLS 300 usable in SBC architectures for DE applications, according to this disclosure. Some of the components of the FLS 300 shown in FIG. 3 may represent (or be represented by) corresponding components of the system 100 of FIG. 1. As shown in FIG. 3, the FLS 300 includes a master oscillator 301, an optical phase modulator 302, a fiber amplifier chain 303, a delivery fiber 304, a waveform generator 306, a low-pass filter 307, a radio-frequency (RF) amplifier 308, and a controller 310.

The FLS 300 includes a MOPA formed by the master oscillator 301 seeding the fiber amplifier chain 303. In embodiments used in DE applications, the master oscillator 301 is a fiber-coupled distributed-feedback (DFB) or distributed-Bragg-reflector (DBR) diode laser operating in CW constant-power mode and emitting an output beam 305, which is a single-longitudinal-mode (i.e., single-frequency) output beam having a central wavelength $\lambda_0$ approximately in the 1000-1100 nm range. In other embodiments, the master oscillator 301 can be a single-frequency DFB fiber laser or some other type of fiber-coupled single-frequency laser such as a non-planar bulk solid-state laser ring oscillator.

In typical DE applications, the fiber amplifier chain 303 includes one or more amplifier stages featuring ytterbium (Yb)-doped alumino-silicate and/or phospho-silicate fibers including single-transverse-mode and large-mode-area Yb-doped fibers (including tapered and/or micro-structured fibers). In other embodiments, in which the central wavelength of the master oscillator 301 lies approximately in the 1500-1600 nm or 1800-2100 nm, the fiber amplifier chain 303 includes fibers of the same silicate type, but doped with erbium and thulium or holmium, respectively. The fiber amplifier chain 303 may include fiber-coupled inter-stage optical isolators and/or optical band-pass filters. In typical DE applications, the MOPA of the FLS 300 emits CW power in excess of 1 kW, within an output beam of near Gaussian transverse spatial profile characterized by a near-diffraction-limited beam quality factor $M^2 \sim 1$.

Phase Modulation of FLSs and Spectral Sampling

In the FLS 300, the optical output of the master oscillator 301 is transmitted through the optical phase modulator 302 prior to being injected in the fiber amplifier chain 303.

The output fiber of the master oscillator 301 is fusion-spliced to the input fiber of the optical phase modulator 302. The optical phase modulator 302 includes a fiber-coupled electro-optically active crystal (e.g., lithium niobate) waveguide driven by a radio-frequency (RF) voltage source. The voltage source can, for example, comprise the waveform generator 306, followed by the (programmable or fixed) RF low-pass filter 307 and the RF amplifier 308. In some embodiments, the waveform generator 306 can be a commercial-off-the-shelf digital function generator or arbitrary waveform generator producing a sinusoidal voltage signal of controllable frequency and amplitude. Alternatively, a multi-tone function generator capable of generating multiple sinusoidal voltage signals of different frequencies can also be used. In some embodiments, this function generator can be a direct digital synthesizer or other type of programmable arbitrary digital voltage-waveform generator.

In the FLS 300, the controller 310 can be used to perform one or more algorithms and control operations to control the optical phase modulation by the optical phase modulator 302. The controller 310 can be programmable, and can include any suitable combination of hardware, firmware, and software for control of other components, including the optical phase modulator 302. For example, the controller 310 could denote at least one processor 311 configured to execute instructions obtained from at least one memory 312. The controller 310 may include any suitable number(s) and type(s) of processors or other computing or control devices in any suitable arrangement. Example types of controllers 310 include microprocessors, microcontrollers, digital signal processors, field programmable gate arrays, application specific integrated circuits, and discrete circuitry. In some embodiments, the operations of the controller 310 described herein may be divided and performed by two or more separate controllers 310.

The remainder of this section details an example of how optical phase modulation of the master oscillator 301 can be used to shape its emitted optical power spectrum for purposes that include realizing spectral distributions yielding good spatial quality for beams emitted by the FLS 300 driven by the master oscillator 301 and diffracted off a SBC grating.

The time(t)-dependent optical (electric) field E(t) associated with each FLS can be written in complex notation as:

$$E(t)=E_0(t)\exp[2\pi i v_0 t+i\varphi(t)]. \quad (21)$$

Here, $E_0(t)$ is the slowly varying, real optical-field amplitude; $v_0$ is the optical-field central (carrier) frequency, expressed in Hz ($v_0=c/\lambda_0$, where c is the vacuum speed of light and $\lambda_0$ the optical-field central wavelength); and $\varphi$ is the optical phase term. The power spectrum, P(v), of the optical field produced by each FLS can be expressed, in complex notation, as:

$$P(v)=|\int_{-\infty}^{\infty}E_0(t)\exp[2\pi i(v-v_0)t+i\varphi(t)]dt|^2. \quad (22)$$

The expression in the right-hand side of Equation (22) is the absolute square of the Fourier transform of the optical field given in Equation (21). Based on Equation (22), any practically relevant functional shape of P(v) can be realized via Fourier transformation by providing appropriate functional forms for the optical-field amplitude, $E_0(t)$, and phase, $\varphi(t)$.

In typical DE applications, the output beam is CW, which means $E_0$ is constant (not time-dependent). In principle, amplitude modulation could be applied to $E_0$ to help shape the power spectrum. However, any amplitude modulation would cause the optical field to attain peak power in excess of the average (CW) value. While the higher peak power would not improve DE effectiveness (which is linked to thermal effects at the target driven by the laser average power only), it could trigger unwanted nonlinear optical effects within the FLSs. For such reason, amplitude modulation should be avoided as a means to shape the FLS power spectrum and only phase modulation should be leveraged. In the remainder of this document, the optical field amplitude will thus be assumed to be constant: $E_0(t)=E_0$.

In the case of phase modulation imparted via a single-frequency sinusoidal voltage generator, the optical phase term can be written in complex notation as:

$$\varphi(t)=\varphi_M \exp(2\pi i v_M t). \quad (23)$$

Here, $\varphi_M$ is the zero-to-peak phase excursion (expressed in radians) and $v_M$ (Hz) is the frequency of the sinusoidal modulation frequency. The expression of the optical field containing this phase term is obtained by substituting Equation (23) into (21):

$$E(t)=E_0 \exp(2\pi i v_0 t)\exp[\varphi_M \exp(2\pi i v_M t)], \quad (24)$$

where the amplitude $E_0$ is taken to be constant as discussed above.

Equation (24) can be recast via the Jacobi expansion as a sum of sinusoidal terms:

$$E(t)=E_0 \exp(2\pi i v_0 t)\Sigma_{n=-\infty}^{\infty} J_n(\varphi_M)\exp(2\pi i n v_M t). \quad (25)$$

Here, $J_n$ denotes Bessel functions of first kind and order n. Substituting Equation (25) into (22) yields:

$$P(\tilde{v})=|E_0|^2 \Sigma_{n=-\infty}^{\infty} |J_n(\varphi_M)|^2 \delta(\tilde{v}-n v_M), \quad (26)$$

where $\tilde{v} \equiv v-v_0$ and $\delta$ is the Dirac delta function.

The power spectrum in Equation (26) includes an infinite series of narrow lines frequency-spaced by $v_M$, with the n-th line in the series having amplitude given by the absolute square of the n-th order Bessel function evaluated at the phase excursion $\varphi_M$. In practice, the series is truncated to a finite index value N:

$$P(\tilde{v})=|E_0|^2 \Sigma_{n=-N}^{N} |J_n(\varphi_M)|^2 \delta(\tilde{v}-n v_M), \quad (27)$$

where $Nv_M < \Delta v_{mod} \leq (N+1)v_M$, with $\Delta v_{mod}$ being the effective bandwidth of the phase modulation apparatus.

By selecting different values for the modulation frequency $v_M$ and phase excursion $\varphi_M$, a variety of power spectra can be generated. However, the diversity among the spectra generated through Equation (27) is limited by the fact that $v_M$ and $\varphi_M$ are the only free parameters. In particular, choosing a value for $\varphi_M$ uniquely determines the amplitude of all spectral lines at once.

The spectral diversity can be greatly increased by driving the phase modulator with a superposition of multiple sinusoidal voltage waveforms, each having its own frequency and amplitude. In one embodiment, the different frequencies can be harmonics of a given tone and produced by a programmable RF/microwave comb generator. In alternative embodiments, a set of independent sinusoidal waveforms can be synthesized by an arbitrary waveform generator. In these embodiments, the imparted optical phase term can generally be expressed as:

$$\varphi(t)=\Sigma_{k=1}^{K} \varphi_k \exp(2\pi i v_k t+i\mu_k), \quad (28)$$

where $v_k$ and $\mu_k$ denote the frequency and phase offset of the k-th sinusoidal waveform and K is the total number of waveforms employed.

Substituting Equation (28) into (21) yields:

$$E(t)=E_0 \exp(2\pi i v_0 t)\Pi_{k=1}^{K} \Sigma_{n=-N}^{N} J_n(\varphi_k)\exp(2\pi i n v_k t+in\mu_k), \quad (29)$$

where $\Pi$ denotes the product of terms indexed by k.

As discussed for Equation (27), the value of N to which the summation in Equation (29) is truncated is determined by the bandwidth $\Delta v_{mod}$ of the phase modulation apparatus being used, such that $Nv_K < \Delta v_{mod} \leq (N+1)v_K$, where $v_K$ is taken to be the highest modulation frequency used.

Substituting Equation (29) into (22) finally yields:

$$P(\tilde{v})=|E_0|^2 \Sigma_q \mathcal{A}_q \delta(\tilde{v}-\tilde{v}_q). \quad (30)$$

Here, $v_q$ is a linear combination of the applied modulation frequencies and can be expressed as:

$$\tilde{v}_q = \Sigma_{k=1}^{K} \alpha_{qk} v_k, \quad (31)$$

where each coefficient $\alpha_{qk}$ can take on any integer value between $-N$ and $N$, i.e., 2N+1 values overall.

The sum over the index q covers every possible way to obtain a list of K numbers each taking one of the possible 2N+1 values between –N and N. Accordingly, the maximum number of terms in the q summation (hence the maximum number of frequencies in the power spectrum in Equation (30)) is given by the binomial coefficient $$\binom{2N+1}{k}.$$

In practice, only the frequencies<$\Delta v_{mod}$ are included. If the frequencies $\tilde{v}_q$ are all distinct, then the $\mathcal{A}_q$ terms in Equation (30) take on the form:

$$\mathcal{A}_q = \Pi_{k=1}^{K} |J_{a_{qk}}(\varphi_k)|^2, \quad (32)$$

where the coefficients $\alpha_{qk}$ are the same as those in Equation (31).

In the general case, a same frequency $\tilde{v}_q$ could be realized by distinct sets of $\alpha_{qk}$ coefficients:

$$\tilde{v}_q = \begin{cases} \sum_{k=1}^{K} a_{qk}^{(1)} v_k \\ \sum_{k=1}^{K} a_{qk}^{(2)} v_k \\ \dots \\ \sum_{k=1}^{K} a_{qk}^{(U)} v_k \end{cases} \quad (33)$$

where the index (u) denotes each set and U is the total number of such sets.

Accordingly, in this general case, the $\mathcal{A}_q$ terms in Equation (30) takes on the form:

$$\mathcal{A}_q = \left| \sum_{u=1}^{U} \prod_{k=1}^{K} J_{a_{qk}^{(u)}}(\varphi_k) \exp(i a_{qk}^{(u)} \mu_k) \right|^2. \quad (34)$$

As anticipated and inferred from Equations (33) and (34), the power spectrum in Equation (30) can yield a far richer variety of spectral components than that in Equation (27). The amplitudes and frequencies of such spectral components can be controlled by choosing the number K of waveforms used as well as selecting distinct sets of values for the entries in the vectors ($\varphi_1, \ldots, \varphi_K$), ($v_1, \ldots, v_K$), and ($\mu_1, \ldots, \mu_K$). The greater spectral diversity in turn provides greater resolution and more degrees of freedom in the design of specific spectral shapes that can advantageously be used to attain the objectives of SBS suppression, output power maximization, and combined-beam quality optimization.

While the mathematical discussion presented above specifically addresses phase modulation patterns based on sinusoidal waveforms, rich spectral diversity can also be achieved by means of other periodic patterns including, but not limited to, truncated ramps, saw-tooth, or other repetitive piece-wise signals produced by digital function generators Although FIG. 3 illustrates one example FLS usable in SBC architectures for DE applications, various changes may be made to FIG. 3. In general, the makeup and arrangement of the FLS 300 are for illustration only. Components could be added, omitted, combined, or placed in any other configuration according to particular needs.

Suppression of Stimulated Brillouin Scattering (SBS)

SBS arises from scattering of the main FLS laser beam (referred to as "pump" beam in the remainder of this section) off a spatial refractive-index modulation in the fiber core caused by acoustic waves (phonons) propagating in the fiber. The scattered beam is down-shifted with respect to the carrier optical frequency of the pump beam, the shift being ~15 GHz for pump-beam wavelengths ~1 μm (a common wavelength for FLSs used in DE applications). The SBS-generated beam propagates backward with respect to the pump beam, carrying a fraction of its power. Once SBS sets in, more power is nonlinearly transferred from the pump to the SBS beam as the pump beam power increases, the transfer being more effective in longer fibers and/or smaller fiber cores. Because of its nature, SBS can deplete the power that a high energy laser (HEL) weapon system delivers on target and can potentially damage the HEL components. It should therefore be avoided in DE applications.

SBS is suppressed when the desired HEL output power lies below the threshold pump-beam power for SBS, $P_{SBS}^{th}$. Several definitions for $P_{SBS}^{th}$ can be adopted, depending on the specific application requirements. For example, $P_{SBS}^{th}$ can be defined as the pump-beam power level for which the maximum (peak) SBS power measured in the backward direction equals the power resulting from Rayleigh backscattering in the fiber core.

A useful estimate for the value of $P_{SBS}^{th}$ in the case of single-frequency pump is the following:

$$P_{SBS}^{th} \sim 21 \frac{A}{g_{SBS} L}, \quad (35)$$

where A is the optical mode-field area within the fiber core, L is the effective fiber length, and $g_{SBS}$ is the peak gain for the SBS process (~4×10⁻¹¹ m/W).

In typical FLSs used for DE applications, reasonable values for A and L are ~5×10⁻¹⁰ m² and ~2 m, respectively, which yields $P_{SBS}^{th}$~130 W. As the typical emitted power values for each of the spectrally combined FLSs used in such applications is greater than 1 kW, SBS is effectively suppressed if the value $P_{SBS}^{th}$ is correspondingly increased by a factor of at least 10 versus the single-frequency value.

As previously discussed, an effective approach to SBS suppression is to deliberately broaden the optical spectrum of the pump beam, which is implemented by phase-modulating the master oscillator prior to fiber amplification. In fact, $P_{SBS}^{th}$ significantly increases when the coherence time (i.e., the inverse spectral width) of the pump beam is shorter than the lifetime, $T_{SBS}$, of acoustic phonons in fibers ($T_{SBS}$~5 ns).

The phonon lifetime is also related to the full width at half maximum, $\Delta v_{SBS}$, of the SBS gain spectrum by $$\Delta v_{SBS} = \frac{1}{(2\pi T_{SBS})} \sim 32 \text{ MHz}. \quad (36)$$

If the pump-beam optical power spectrum thus consists of a series of narrow spectral lines and such lines have mutual frequency spacing, $\Delta v$, greater than the SBS gain bandwidth ($\Delta v > \Delta v_{SBS}$), then each of the spectral components can be regarded as an independent pump beam for SBS. In this case, based on Equation (30), the FLS emitted power, P, can be written as:

$$P = \Sigma_q P_q = P_{max} \Sigma_q \beta_q. \quad (37)$$

Here, the index q spans all the spectral lines, $P_{max}$ is the maximum power among the spectral lines, and each $\beta_q$ is a number corresponding to the q-th line amplitude divided by $P_{max}$. Accordingly, $0 < \beta_q \leq 1$ for every value of q. If $P_{SBS}^{th}$ is the SBS threshold power in the case of single-frequency power spectrum, the SBS threshold power in the multi-spectral line case described by Equation (37) is given by $gP_{SBS}^{th}$ where the SBS suppression factor g is defined as:

$$g = \Sigma_q \beta_q. \quad (38)$$

The value of g is always greater than 1, since, by definition, at least one of the $\beta_q$ coefficients is equal to 1. On the other hand, the maximum value of g (hence the maximum level of SBS suppression for a given number of spectral lines) is obtained when all $\beta_q = 1$, i.e., when all lines in the power spectrum exhibit the same amplitude. However, it can be demonstrated mathematically that it is not possible to produce such a flat-top spectral distribution by means of optical phase modulation alone. Different values of g can be obtained based on the number and amplitude of spectral components in the output beam of each FLS, which are in turn determined by the specifics of the imparted phase modulation pattern, as discussed above. Each value of g corresponds, in turn, to a different degree of suppression of SBS, hence different SBS-free power levels achievable by individual FLSs.

Concomitant SBS Suppression and SBC Beam Quality Optimization Method

Embodiments of this disclosure provide optimized optical architectures for SBC of FLSs based on diffractive combining gratings. In such architectures, spectral broadening is induced in the master oscillator of each FLS so as to suppress SBS. Methods to induce such spectral broadening are disclosed, such that the spectrally broadened FLSs combine to yield good beam quality in the beam emerging off the grating.

In some embodiments, the output beam from the master oscillator of each FLS is externally phase-modulated (as described with respect to FIG. 3), such that its optical power spectrum exhibits discrete spectral lines spaced by $\Delta \nu > \Delta \nu_{SBS}$. The amplitude and frequency of the constituent spectral lines are controlled by driving an optical phase modulator with a superposition of sinusoidal voltage waveforms of programmable frequency and amplitude.

As discussed above, the number and amplitude of the spectral lines, i.e., the width and shape of the power spectrum, determine the level of SBS suppression, which can be quantitatively estimated by calculating the SBS suppression factor g defined in Equation (38). In general, a nearly flat-top spectrum featuring a relatively large number of spectral lines having similar amplitudes is better suited to yielding high SBS threshold power, thus maximizing the laser power that can be attained prior to the onset of SBS. However, as discussed above, this flat-top spectral shape cannot be realized by phase modulation alone, and thus its properties represent an upper bound to which it is desired that optimal spectral distributions, realizable through phase modulation, come as close as possible.

As previously discussed, however, the characteristics of the power spectrum (width and shape) also affect the beam quality of the beam upon diffraction off the gratings, through the expression for the diffracted optical intensity given in Equations (12) and (14), for discrete and continuous spectral distributions, respectively.

As stated earlier in this document, several examples of SBS suppression in FLSs (especially for kW-power-class, CW FLSs intended for DE applications) are based on phase-modulating the master oscillators of such FLSs with noise-like patterns such as Gaussian thermal noise and pseudo-random bit sequences. However, such approaches have been carried out only for stand-alone FLSs, without analyzing their suitability in multi-FLS SBC architectures. It is moreover known that such non-deterministic phase patterns are non-optimal, as their efficacy depends on fiber length. Particularly, in the relatively short fibers used for kW-class FLS for DE applications, such noise-like patterns may increase the probability of sporadic SBS events, even when the emitted laser power is well below the SBS threshold power ($P_{SBS}^{th}$). The occurrence of such isolated events, related to the stochastic nature of the spectral broadening process, is not predictable and may cause catastrophic damage in the FLS.

To prevent these events, an even more pronounced broadening of the master oscillator spectrum can be sought, which can be wider than needed when using a deterministic approach in order to attain the same level of SBS suppression. Such excess broadening may result in greater beam quality degradation in SBC architectures. In addition, if the necessary master oscillator spectral width ends up exceeding the value of SBS frequency shift, namely ~15 GHz, such downshifted spectral components of the master oscillator/FLS itself, back-reflected by the in-fiber Rayleigh scattering process, may end up directly seeding SBS. In this case, SBS does not build up from noise photons, but from a much higher-power source (the back-reflected laser), which may cause the value of $P_{SBS}^{th}$, hence of the FLS usable output power to be reduced, thereby partly offsetting the benefit of broadening the master oscillator spectrum in the first place.

Methods for spectral optimization (hence beam quality optimization) in SBC architectures will now be described. For the sake of clarity, the methods are illustrated through quantitative examples in the remainder of this section, although, as discussed below, the general methods can equally apply to the design of any FLS-based SBC HEL system.

For this example, it is assumed that a FLS emits a spatially diffraction-limited near-Gaussian beam, characterized by a beam-quality factor $M^2 = 1$, consistent with the FLS final fiber amplifier stage and/or output delivery fiber operating in the fundamental transverse mode. It is also assumed that the FLS being considered belongs in an array of FLSs, the output beams of which are all directed through a transform optical element to overlap at a near-Littrow angle onto a diffractive grating, for the purpose of spectral beam combining, such as described in FIG. 1. It is also assumed that FLS being considered is spectrally broadened for SBS suppression and that, specifically, such spectral broadening is intended to increase the SBS threshold power $P_{SBS}^{th}$ by a factor of at least 10 over its single-frequency value given in Equation (35) such that the FLS in question can attain kW output power. Relevant parameters for the FLS and grating are given in Table 1.

TABLE 1

Numerical values used in the example discussed above.
The values are consistent with practical realizations
of fiber-based SBC architectures for DE applications.

| Parameter | Value |
| --- | --- |
| FLS central wavelength, $\lambda_0$ | 1060 nm |
| FLS $1/e^2$ beam radius at the grating, $w_{x0}$ | 7.5 mm |
| Number of grating lines per unit length, N | 1160 mm$^{-1}$ |
| Littrow angle, $\theta_L$ | 0.66 rad (~38°) |

The methods described herein comprise spectrally broadening the FLS output as needed to achieve the target SBS suppression by applying optical-phase modulation based on a linear superposition of sinusoidal waveforms. As a first objective, this phase-modulation pattern must yield an optical power spectrum consisting of discrete lines and characterized by a SBS suppression factor g≥10, based on the definition of g given in Equation (38). As a second, concurrent objective, the power spectrum produced by the chosen phase-modulation pattern must be such that the FLS output beam undergoes <10% beam quality degradation in the dispersive direction upon diffraction off the SBC grating compared to the incident beam, i.e., $M^2<1.1$ for the diffracted beam.

TABLE 2

Values of frequencies and zero-to-peak phase excursion
associated with the three components of the phase
modulation pattern in Equation (39).

| Simulation parameter | Values (a) | Values (b) |
| --- | --- | --- |
| $v_1$ | 0.25 GHz | 0.25 GHz |
| $v_2$ | 0.75 GHz | 0.75 GHz |
| $v_3$ | 1.25 GHz | 1.25 GHz |
| $\varphi_1$ | 0.075 rad | 1.5 rad |
| $\varphi_2$ | 1.405 rad | 2.8 rad |
| $\varphi_3$ | 1.45 rad | 3.0875 rad |
| Phase-modulation bandwidth, $\Delta v_{mod}$ | 10 GHz | 10 GHz |

To achieve these concurrent objectives, an optical phase modulation pattern can be used, which, in this example, is given by the superposition of three sinusoidal waveforms comprising a fundamental tone mixed with its third and fifth harmonics:

$$\varphi(t)=\varphi_1 \exp(2\pi i v_1 t)+\varphi_2 \exp(2\pi i v_2 t)+\varphi_3 \exp(2\pi i v_3 t). \quad (39)$$

For simplicity, the waveforms used are assumed to be in phase and phase-locked to each other, so that constant phase terms are omitted from Equation (39). In practice, this can be achieved by electronically generating the harmonics from a single reference source, such as an oscillator for example.

Figure 4:
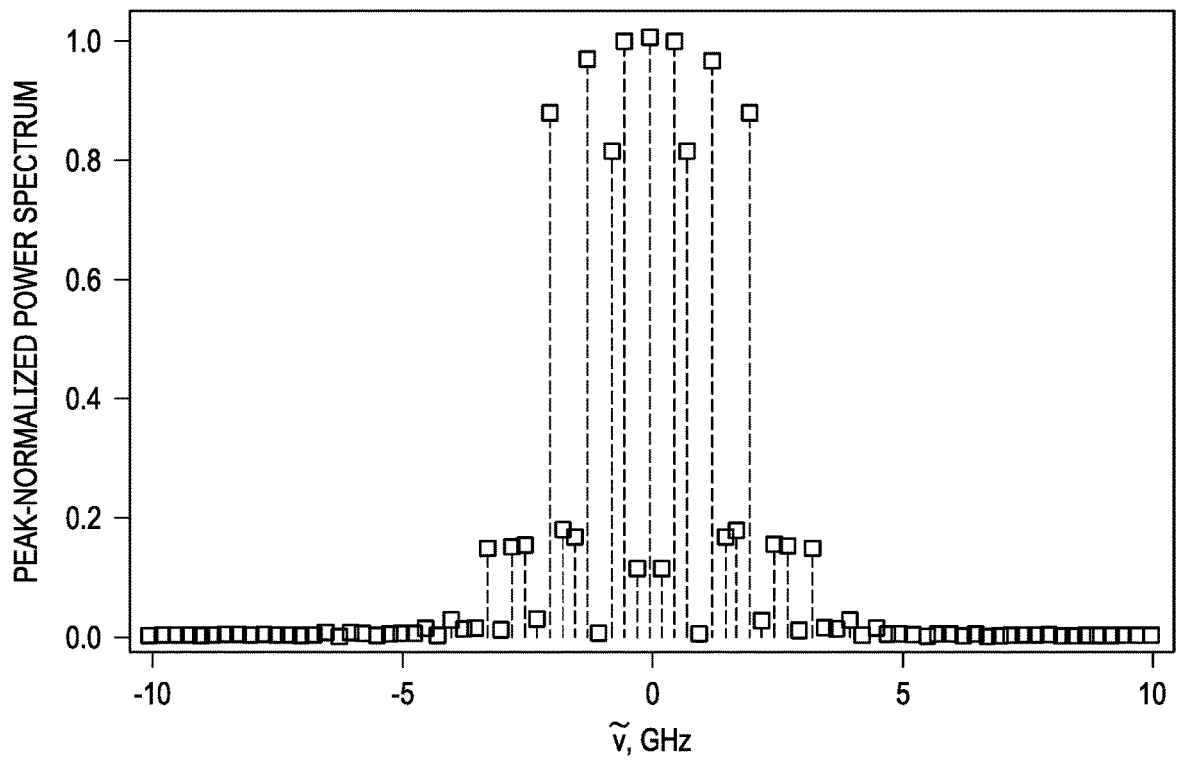
FIG. 4 illustrates an example peak-normalized power spectrum for a fiber laser source output spectrally broadened via a phase modulation pattern, according to this disclosure.

The optical power spectrum associated with the phase modulation pattern in Equation (39) can be obtained numerically based on Equation (30) by using the parameter values and bandwidth-related truncation ($\Delta v_{mod}<10$ GHz) given in Table 2, "Values (a)" as well as neglecting amplitude terms of vanishing value. FIG. 4 illustrates the peak-normalized power spectrum for the FLS output spectrally broadened via the phase modulation pattern given in Equation (39). As shown in FIG. 4, with these approximations, the spectrum is limited to 81 frequencies inter-spaced by $\Delta v=0.25$ GHz and is given, in peak-normalized form, by:

$$\frac{P(\tilde{v})}{P(0)} = \sum_{p=-40}^{40} i_q \, \delta(\tilde{v} - q\Delta v), \quad (40)$$

where the normalized amplitude coefficients $i_q$ are defined in Equation (12).

The SBS suppression g factor associated with this spectrum can be numerically calculated to be:

$$g=\Sigma_{q=-40}^{40} i_q=10.21, \quad (41)$$

which meets the first objective, namely increasing the value of $P_{SBS}^{th}$ by a factor of at least 10.

According to Equation (12), the dispersive-direction optical intensity of the spectrally broadened beam upon diffraction off the grating is given by:

$$I_x(x, z) \propto \sum_{p=-40}^{40} i_q \, \exp\left\{-2\left[\frac{x - z\gamma_q}{w_x(z, \lambda_0)}\right]^2\right\}. \quad (42)$$

In Equation (42), $w_x(z, \lambda_0)$ is defined in Equation (5) and, based on Equation (13):

$$\gamma_q = \frac{\mathcal{N}(\lambda_q - \lambda_0)}{\cos \theta_L} = q\frac{\mathcal{N} \lambda_0^2/c}{\cos \theta_L}\Delta v. \quad (43)$$

Figure 5:
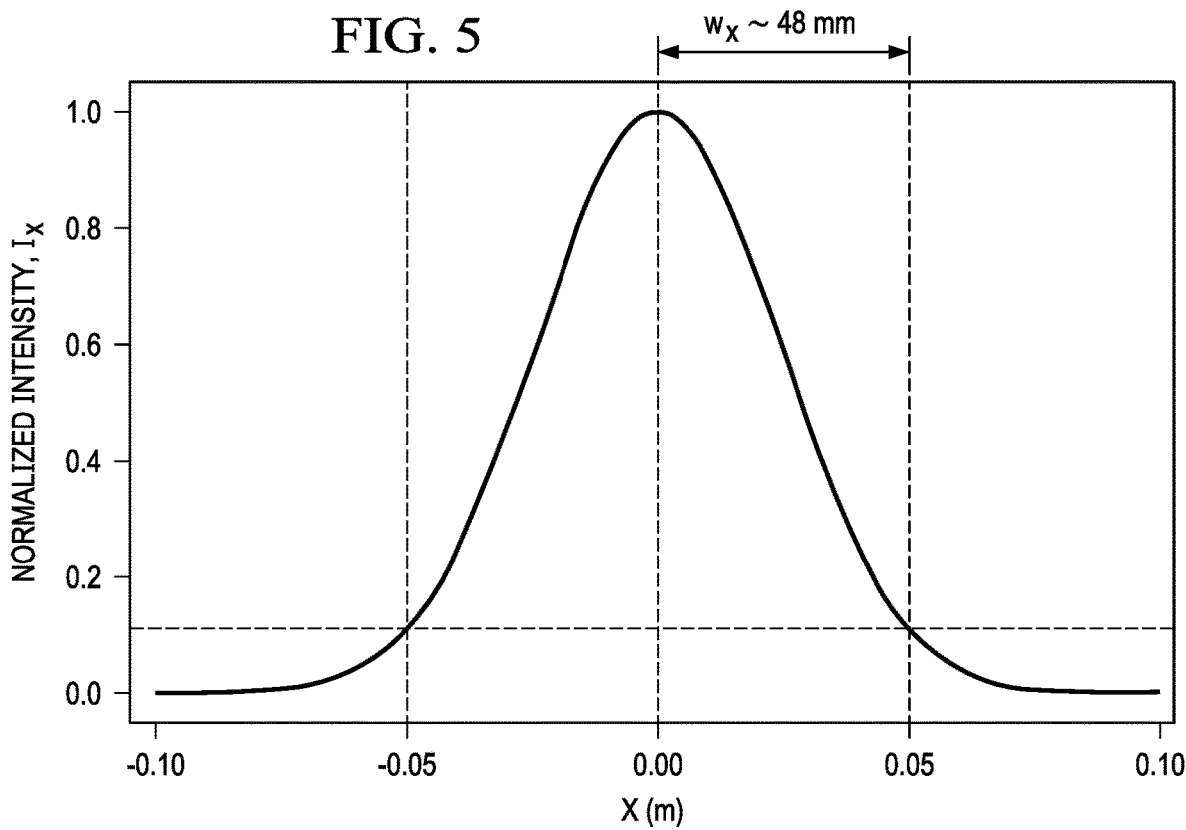
FIG. 5 illustrates a far-field, peak-normalized optical intensity profile along a grating dispersive direction of the spectrally broadened beam diffracted off the grating for the example shown in FIG. 4.

FIG. 5 illustrates the far-field (e.g., z~1 km), peak-normalized optical intensity profile along the grating dispersive direction (x) of the spectrally broadened beam diffracted off the grating for the example shown in FIG. 4. The $1/e^2$ radius is 7.5 mm at the grating (z~0) and ~48 mm at z~1 km. Based on Equation (18), the corresponding value of $M^2$ in the dispersive direction is given by:

$$M^2 = \frac{\pi w_x' w_{x0}}{\lambda_0 \; z} \sim 1.064. \quad (44)$$

Here, $w_x'$ is calculated by numerically solving for x the equation: $I_x(x,z)=I_x(0,z)e^{-2}$, for large values of z. The obtained value of $M^2$ is within 10% of the diffraction limit, which meets the second objective.

To illustrate the impact of the spectrum characteristics on the diffracted-beam beam quality, the above analysis can be repeated using different parameters in Equation (39), specifically those listed in the column "Values (b)" in Table 2.

Figure 6A:
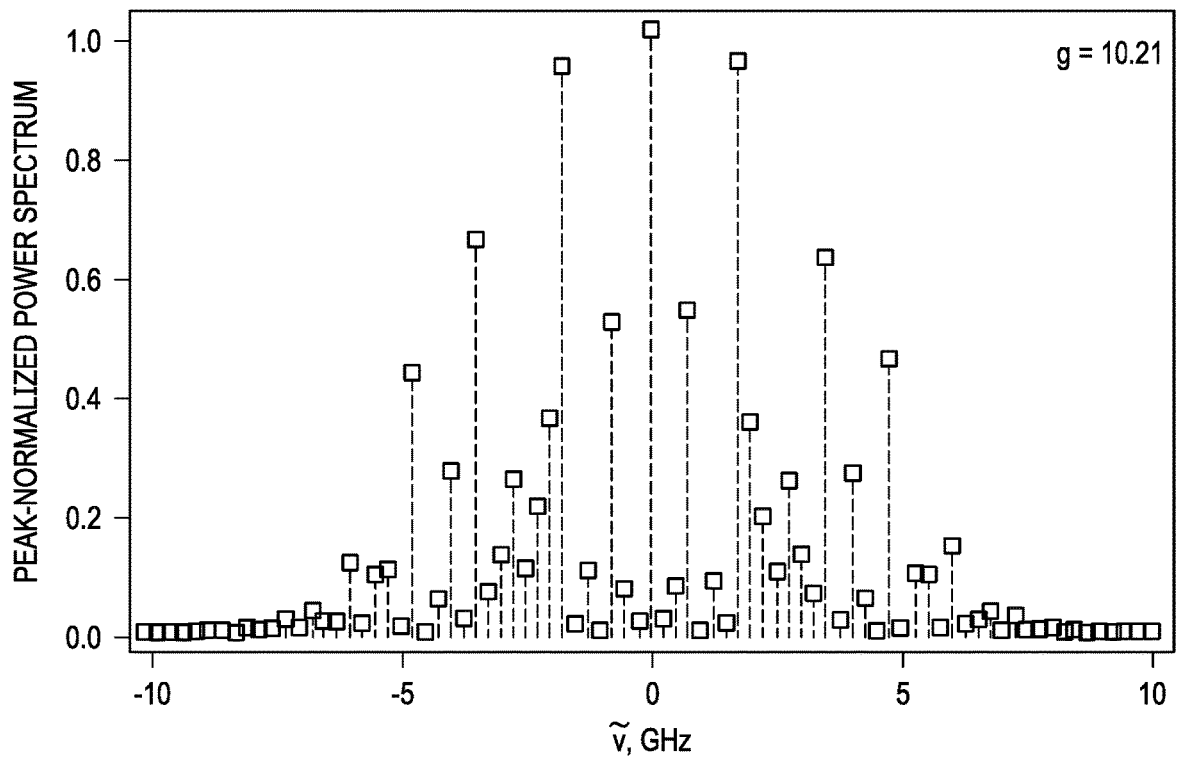
FIGS. 6A and 6B illustrate the peak-normalized power spectrum and the far-field optical intensity upon diffraction off the grating, respectively, resulting from an alternative phase-modulation pattern based on the same frequencies as those disclosed in FIGS. 4 and 5, but with different phase excursion values, according to this disclosure.
Figure 6B:
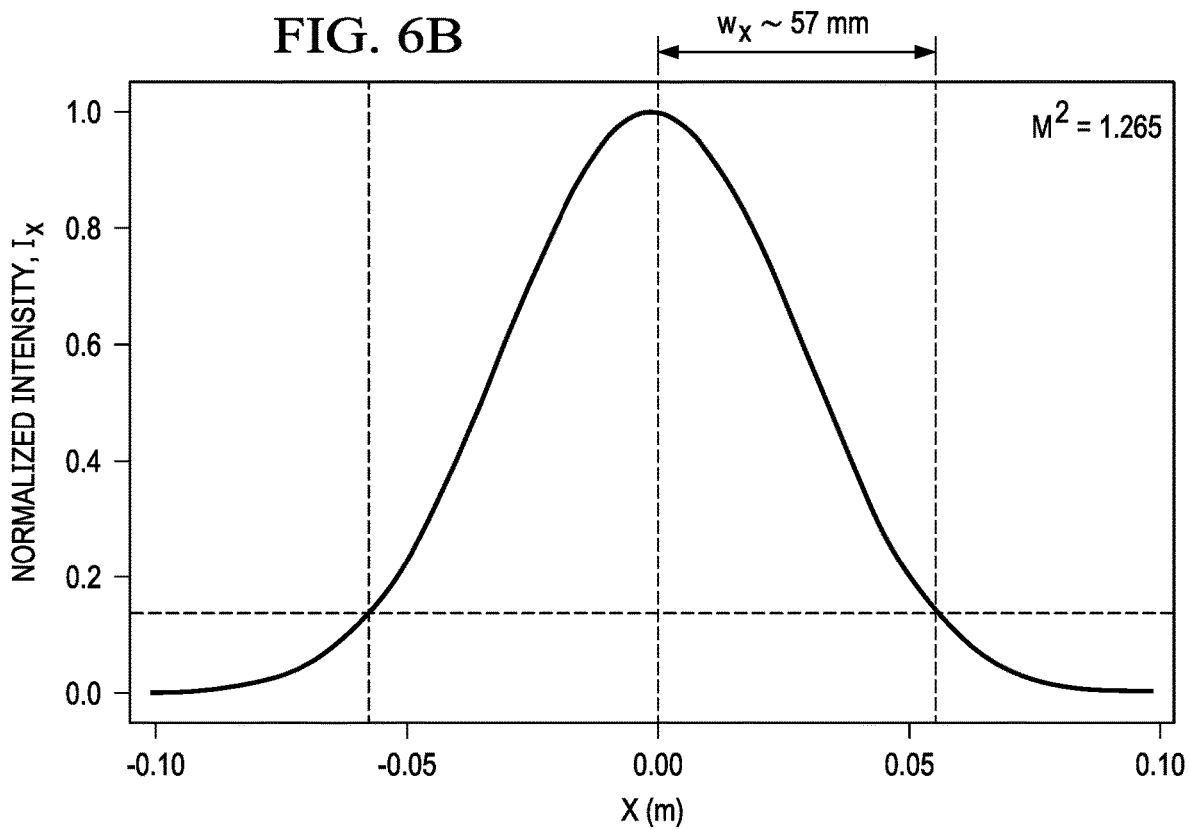

FIGS. 6A and 6B illustrate the peak-normalized power spectrum and the far-field optical intensity upon diffraction off the grating, respectively, resulting from an alternative phase-modulation pattern based on the same frequencies as those disclosed in FIGS. 4 and 5, but with different phase excursion values. As shown in FIGS. 6A and 6B, the alternative phase modulation pattern, which differs from the one described above only in the phase excursion values associated with each frequency, yields the same SBS suppression factor (g=10.21) as the previous one, thereby offering no additional advantage in terms of power scaling of the FLS output. However, due to the different spectral characteristics, the obtained value of $M^2$ now is ~1.26, which corresponds to a 26% degradation over the beam quality of the incident beam, which would not meet the stated beam quality objective.

While the two examples discussed above are useful for illustrating principles of the embodiments disclosed in this document, there are other examples that may be more advantageous in terms of concomitant maximization of SBS-free output power and beam quality in SBC of FLSs.

Figure 7:
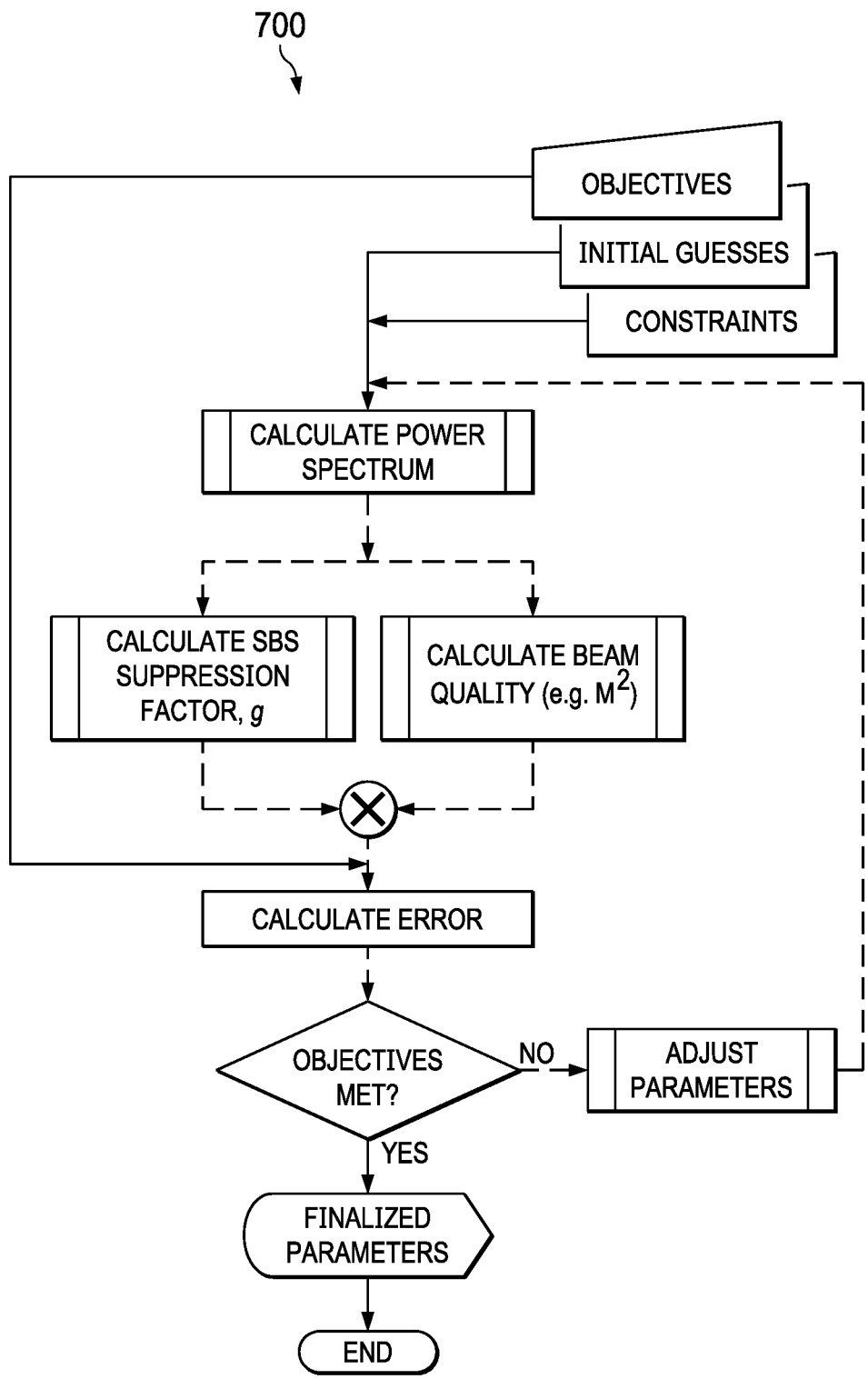
FIG. 7 illustrates an example process for optimizing the parameters of the optical phase modulation in spectrally beam combined fiber laser sources, according to this disclosure.

FIG. 7 illustrates an example process 700 for optimizing the parameters of the optical phase modulation in spectrally beam combined fiber laser sources, according to this disclosure. As shown in FIG. 7, optimal solutions can be obtained by starting from initial estimates for frequencies, $v_k$, and phase excursions, $\varphi_k$, to be used for optical phase modulation. From these estimates, numerical routines written in a high-level programming language can be used to calculate the optical power spectrum and the associated SBS suppression factor, g, and beam quality off the grating, $M^2$, as discussed above. The obtained values are compared with pre-set objectives. These objectives may include the required power level for the SBC output beam, the power back-reflected by the SBS process, and the beam quality, which can in turn be quantified by the $M^2$ factor or by other means to assess beam quality such as the power-in-the-bucket metric, Strehl ratio, or diameter x divergence-angle beam parameter product.

Another objective can be a requirement for the minimum beam size at the grating, which is the optical component of an SBC system on which the beam optical intensity attains its peak value. This value is always required to be below the grating surface damage threshold and might be required to be further lowered to avoid thermo-optic beam distortion following the diffraction off the grating. In some embodiments, the beam quality objective might pertain to the laser beam ultimately delivered by a weapon system, and therefore relate to the SBC output beam as transmitted through optical elements of a beam director, including, for example, a beam scraper/hard-aperture and beam expander. In this case, the beam-quality objective may include a beam-size requirement to be met at the beam director output end and/or a beam clipping/aperturing requirement. Until the objective values are obtained within an accepted error margin, the spectral parameters are iteratively refined through a process of constrained optimization. The optimization constraints may include the phase-modulation bandwidth, maximum values for phase excursions, and diffractive-grating line density/dispersion. In typical embodiments, the optimization process is implemented via a deterministic local-search technique such as a hill-climbing or steepest-descent algorithm. The optimization process might also be implemented via a metaheuristic, such as a stochastic-optimization or genetic algorithm.

Figure 8:
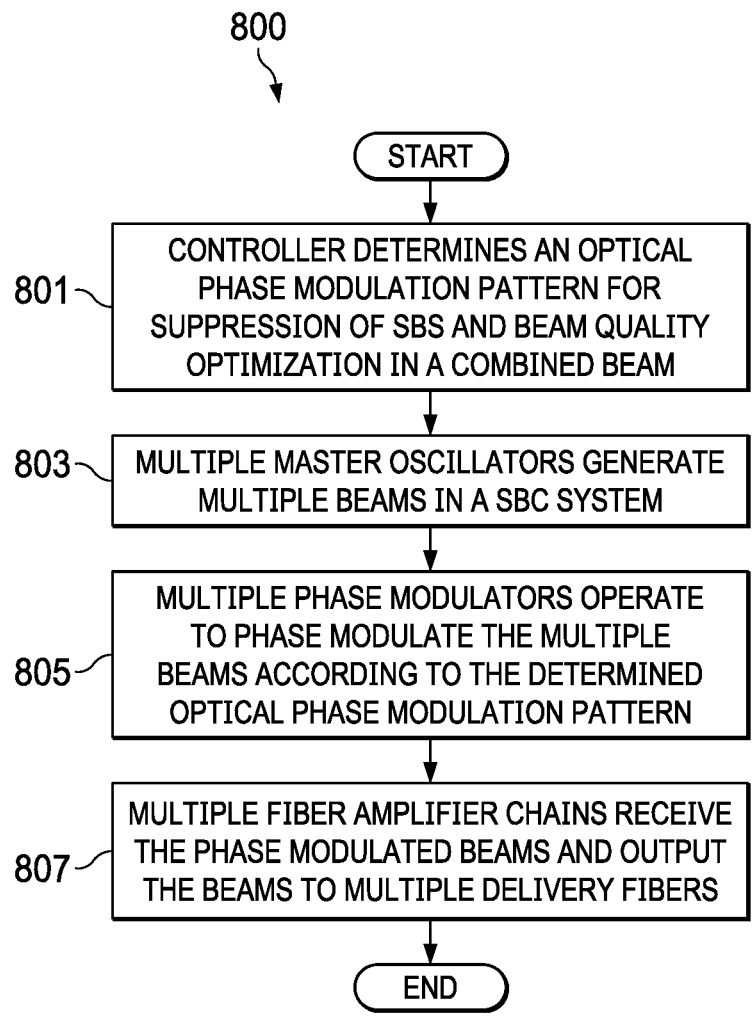
FIG. 8 illustrates an example method for spectral line shape optimization for spectral beam combining of fiber lasers, according to this disclosure.

FIG. 8 illustrates an example method 800 for spectral line shape optimization for spectral beam combining of fiber lasers according to this disclosure. For ease of explanation, the method 800 is described as being performed using the system 100 of FIG. 1, which can include multiple FLSs 300 of FIG. 3. However, the method 800 could be used with any other suitable device or system.

At step 801, a controller determines an optical phase modulation pattern for suppression of SBS in a combined beam that emerges off a diffractive grating and maximization of an output power of the combined beam. This may include, for example, the controller 310 determining an optical phase modulation pattern for use by multiple phase modulators 302. The pattern may be determined using the optimization method described above. In particular, the pattern may be determined using the iterative process 700 described in FIG. 7.

At step 803, multiple master oscillators generate multiple beams in a SBC system. This may include, for example, master oscillators 301 generating multiple beams in the FLSs 300.

At step 805, multiple phase modulators operate to phase modulate the multiple beams according to the determined optical phase modulation pattern. This may include, for example, the multiple phase modulators 302 performing phase modulation on the multiple beams received from the master oscillators 301.

At step 807, multiple fiber amplifier chains receive the phase modulated beams and output the beams to multiple delivery fibers for subsequent combining into the combined beam at the diffractive grating. This may include, for example, multiple fiber amplifier chains 303 receiving the phase modulated beams from the phase modulators 302 and outputting the beams to multiple delivery fibers 304.

Although FIG. 8 illustrates one example of a method 800 for spectral line shape optimization for spectral beam combining of fiber lasers, various changes may be made to FIG. 8. For example, while shown as a series of steps, various steps shown in FIG. 8 could overlap, occur in parallel, occur in a different order, or occur multiple times. Moreover, some steps could be combined or removed and additional steps could be added according to particular needs.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," or "system" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
    at least one controller configured to determine an optical phase modulation pattern using an iterative multi-objective optimization algorithm that simultaneously optimizes multiple objectives, the multiple objectives comprising (i) suppression of stimulated Brillouin scattering (SBS) in a combined beam that emerges off a diffractive grating in a spectral beam combining (SBC) system, (ii) maximization of an output power of the combined beam, and (iii) maximization of a beam quality factor of the combined beam;
    multiple master oscillators configured to generate multiple beams in the SBC system;
    multiple phase modulators configured to phase modulate the multiple beams according to the determined optical phase modulation pattern; and
    multiple fiber amplifier chains configured to receive the phase modulated beams from the master oscillators and output the beams to multiple delivery fibers for subsequent combining into the combined beam at the diffractive grating,
    wherein the phase modulators are configured to phase modulate the multiple beams using deterministic, repetitive waveforms such that an optical power spectrum output from the fiber amplifier chains comprises multiple discrete spectral lines spaced by $\Delta v > \Delta v_{SBS}$, where $\Delta v$ is a frequency spacing of the multiple discrete spectral lines and $\Delta v_{SBS}$ is a SBS gain bandwidth.

2. The system of claim 1, wherein, to phase modulate the multiple beams, the multiple phase modulators are configured to produce in each master oscillator an optical power spectrum of algorithmically controlled line shape and line width in each of the multiple beams.

3. The system of claim 1, wherein the waveforms comprise a superposition of sinusoidal signals having different amplitudes, frequencies, and phases.

4. The system of claim 1, wherein the waveforms comprise a superposition of ramp or saw-tooth signals having different amplitudes, frequencies, and phases.

5. The system of claim 1, wherein each phase modulator comprises an electro-optic crystal waveguide component driven by a radio frequency voltage source.

6. The system of claim 1, wherein the optimization algorithm implements a local-search algorithm or a meta-heuristic.

7. The system of claim 6, wherein the optimization algorithm comprises at least one of a hill climbing algorithm, a steepest- or gradient-descent algorithm, a stochastic-optimization algorithm, or a genetic algorithm.

8. The system of claim 1, wherein the beam quality factor comprises at least one of a $M^2$ beam quality factor, a power-in-the-bucket metric, or a Strehl ratio.

9. The system of claim 1, further comprising:
    at least one optical component configured to direct the beams output from the multiple fiber amplifier chains to spatially overlap onto the diffractive grating.

10. An apparatus comprising:
    at least one controller configured to determine an optical phase modulation pattern using an iterative multi-objective optimization algorithm that simultaneously optimizes multiple objectives, the multiple objectives comprising (i) suppression of stimulated Brillouin scattering (SBS) in a combined beam that emerges off a diffractive grating in a spectral beam combining (SBC) system, (ii) maximization of an output power of the combined beam, and (iii) maximization of a beam quality factor of the combined beam;
    a master oscillator configured to generate a first beam of multiple beams in the SBC system;
    a phase modulator configured to phase modulate the first beam according to the determined optical phase modulation pattern; and
    a fiber amplifier chain configured to receive the phase modulated first beam from the master oscillator and output the first beam to a delivery fiber for subsequent combining of the multiple beams into the combined beam at the diffractive grating,
    wherein the phase modulator is configured to phase modulate the multiple beams using deterministic, repetitive waveforms such that an optical power spectrum output from the fiber amplifier chain comprises multiple discrete spectral lines spaced by $\Delta v > \Delta v_{SBS}$, where $\Delta v$ is a frequency spacing of the multiple discrete spectral lines and $\Delta v_{SBS}$ is a SBS gain bandwidth.

11. The apparatus of claim 10, wherein, to phase modulate the first beam, the phase modulator is configured to produce in the master oscillator an optical power spectrum of algorithmically controlled line shape and line width in the first beam.

12. The apparatus of claim 10, wherein the phase modulator comprises an electro-optic crystal waveguide component driven by a radio frequency voltage source.

13. The apparatus of claim 10, wherein the optimization algorithm implements a local search algorithm.

14. The apparatus of claim 10, wherein the waveforms comprise a superposition of sinusoidal signals having different amplitudes, frequencies, and phases.

15. The apparatus of claim 10, wherein the waveforms comprise a superposition of ramp or saw-tooth signals having different amplitudes, frequencies, and phases.

16. The apparatus of claim 10, wherein the optimization algorithm implements a local-search algorithm or a meta-heuristic.

17. The apparatus of claim 10, wherein the beam quality factor comprises at least one of a $M^2$ beam quality factor, a power-in-the-bucket metric, or a Strehl ratio.

18. The apparatus of claim 10, further comprising:
    at least one optical component configured to direct the beams output from the fiber amplifier chain to spatially overlap onto the diffractive grating.

19. A method comprising:
    determining an optical phase modulation pattern using an iterative multi-objective optimization algorithm that simultaneously optimizes multiple objectives, the multiple objectives comprising (i) suppression of stimulated Brillouin scattering (SBS) in a combined beam that emerges off a diffractive grating in a spectral beam combining (SBC) system, (ii) maximization of an output power of the combined beam, and (iii) maximization of a beam quality factor of the combined beam;
    generating multiple beams using multiple master oscillators in the SBC system;
    phase modulating the beams using multiple phase modulators according to the determined optical phase modulation pattern; and
    receiving the phase modulated beams at multiple fiber amplifier chains from the multiple master oscillators and outputting the beams to multiple delivery fibers for subsequent combining into the combined beam at the diffractive grating,
    wherein the beams are phase modulated using deterministic, repetitive waveforms such that an optical power spectrum output from the fiber amplifier chains comprises multiple discrete spectral lines spaced by $\Delta v > \Delta v_{SBS}$, where $\Delta v$ is a frequency spacing of the multiple discrete spectral lines and $\Delta v_{SBS}$ is a SBS gain bandwidth.

20. The method of claim 19, wherein phase modulating the beams comprises setting an optical power spectrum line shape and line width of the beams.

21. The method of claim 19, wherein each phase modulator comprises a crystal waveguide driven by a radio frequency voltage source.

22. The apparatus of claim 13, wherein the optimization algorithm comprises at least one of a hill climbing algorithm, a steepest- or gradient-descent algorithm, a stochastic-optimization algorithm, or a genetic algorithm.

* * * * *